(12) United States Patent
Ikuta et al.

(10) Patent No.: US 6,956,783 B2
(45) Date of Patent: Oct. 18, 2005

(54) SEMICONDUCTOR MEMORY DEVICE INCLUDING FUSE ELEMENT

(75) Inventors: Hiroaki Ikuta, Kanagawa-ken (JP); Kazuhiko Tomioka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 10/166,594

(22) Filed: Jun. 12, 2002

(65) Prior Publication Data

US 2003/0076715 A1 Apr. 24, 2003

(30) Foreign Application Priority Data

Jun. 12, 2001 (JP) ........................................ 2001-177313

(51) Int. Cl.[7] ................................................. G11C 7/00
(52) U.S. Cl. .................. 365/225.07; 365/200; 365/201; 365/230.06; 365/230.08; 257/209
(58) Field of Search ................................ 365/200, 201, 365/225.07, 230.06, 230.08; 257/209

(56) References Cited

U.S. PATENT DOCUMENTS 6,259,636 B1 * 7/2001 Fukuda et al. .............. 365/200

FOREIGN PATENT DOCUMENTS

| JP | 11-134870 | * | 5/1999 |
| JP | 2000-14384 | | 4/2000 |

* cited by examiner

Primary Examiner—David Nelms
Assistant Examiner—Long Tran
(74) Attorney, Agent, or Firm—Finnegan, Henderson, Farabow, Garrett & Dunner, L.L.P.

(57) ABSTRACT

A semiconductor device includes a semiconductor substrate, an insulating layer formed on the semiconductor substrate, input-output terminals, and a fuse block. A plurality of memory macros each having a plurality of memory cells is arranged on the semiconductor substrate. The insulating layer, which has a window portion, may be formed on the semiconductor substrate and covering the memory macros, the insulating layer having a window portion. The input-output terminals are arranged inline along an edge portion of the surface of the insulating layer. The input-output terminals transmit and receive signals between the memory macros and a circuit external to the semiconductor device. The fuse block is arranged in a space corresponding to the window portion in the insulating layer. The fuse block may include a plurality of fuse elements used to remedy defective portions of the plurality of memory cells in the plurality of memory macros.

23 Claims, 6 Drawing Sheets

SEMICONDUCTOR MEMORY DEVICE INCLUDING FUSE ELEMENT

RELATED APPLICATIONS

This application claims the benefit of priority from prior Japanese Patent Application P2001-177313 filed on Jun. 12, 2001, which is incorporated herein by reference.

FIELD OF THE INVENTION

This invention relates to a semiconductor memory device and, more particularly, to an arrangement of a fuse element used to provide redundancy to the semiconductor memory device.

BACKGROUND OF THE INVENTION

In recent years, fine structure and integration have progressed rapidly particularly in the field of semiconductor memory. As the degree of integration is increased, however, it becomes increasingly difficult to maintain manufacture yield. Redundancy techniques have been used as a means for maintaining the manufacture yield of semiconductor devices. In a redundancy technique, a fuse is formed as a portion of the semiconductor device. This fuse may include, for example, a plurality of memory elements. When a defective portion of a memory cell is discovered, the fuse is cut according to the size of the defective portion of the memory cell. For instance, based on the number of defective memory elements, the fuse may be partitioned by the cut such that the defective memory elements may be replaced by an appropriate number of memory elements in the fuse. Using this technique, the defective memory cells are effectively replaced with spare memory cells and the defective memory cells are remedied.

FIG. 1 is a block diagram showing, schematically, the construction of a semiconductor device. As shown in FIG. 1, the semiconductor device 100 has a plurality of memory macros MM10 to MM50 formed on the same semiconductor substrate as a large scale integration (LSI). The term "macro" means a functional block comprising an aggregate of elements that together perform a particular function. These macros are connected to each other by a chip interior wiring and comprise a system LSI.

In addition to a memory block 110, each of the memory macros MM10 to MM50 includes a fuse block 120 having a plurality of fuse elements used in redundancy. Each of the memory macros MM10 to MM50 also includes a control circuit 130. The fuse element and the control circuit, included within each of the memory macros MM10 to MM50, are used to remedy a memory cell included within a respective memory macro MM10 to MM50.

This system of including individual fuse elements and control circuits in every memory macro is inefficient. Particularly, it is impossible to commonly use any of the fuse elements between different macros. This type of device also lacks area efficiency because a control circuit must be arranged every macro. Further, because a writing operation of the fuse element is performed by a laser blow, and because the laser cannot penetrate areas including bumps, no bumps may be placed in an area of the fuse block corresponding to each of the memory macros MM10 to MM50. This requirement greatly impacts the design of the semiconductor device and makes bump layout difficult. For instance, in the device shown in FIG. 1, formation inhibiting areas A10 to A50, which correspond to the fuse blocks of each of the memory macros, designate areas where bumps cannot be formed. These formation inhibiting areas A10 to A50 are scattered at random on the semiconductor substrate face, and as a result, bump arrangement is greatly restricted.

A structure, as shown in FIG. 2, has been proposed to solve the above problems. FIG. 2 is a block diagram showing the schematic construction of a semiconductor device having plural memory macros. In this construction, a fuse element and a control circuit are separated from each of memory macros MM60 to MM80. Both the fuse element and the control circuit are commonly used in each of the memory macros MM60 to MM80. For example, as shown in FIG. 2, fuse block 140 and control circuit 150 are serially wired to a shift register 160 arranged in each of the memory macros MM60 to MM80.

This construction, however, is also problematic. With respect to the arrangement of bumps, because the fuse block 140 is included in a corner portion of the semiconductor substrate, this corner portion must be absent of bumps. Like the above-described device, bump arrangement is greatly restricted. Further, stresses are particularly concentrated at the corner portion of the semiconductor substrate. These stresses can significantly degrade the reliability of the fuse element. Further, Because the wiring distance between the fuse and each memory macro is different, delay times and resistance values in the wiring between the fuse and each memory macro are different. These differences negatively impact the electric characteristics of the semiconductor device.

SUMMARY OF THE INVENTION

According to an aspect of the present invention, a semiconductor memory device includes a semiconductor substrate, a plurality of memory macros arranged on the semiconductor substrate, where the memory macros each have a plurality of memory cells. The present invention also includes an insulating layer formed on the semiconductor substrate, input-output terminals arranged in line on the surface of the insulating layer, and a fuse block used to remedy a defective portion of the memory cells in the memory macros.

Other features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the FIG. 1 is a plan view of a related semiconductor device.

DETAILED DESCRIPTION OF THE INVENTION

Figure 1:
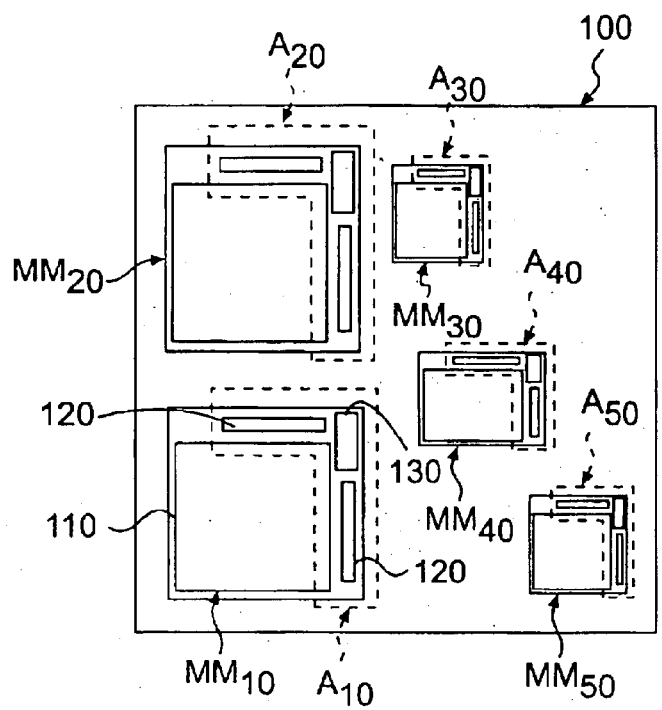

The present invention will be described by embodiments with reference to the drawings. In this description, common portions are denoted by the same reference numerals over all of the drawings.

Figures 3A, 3B, 3C:
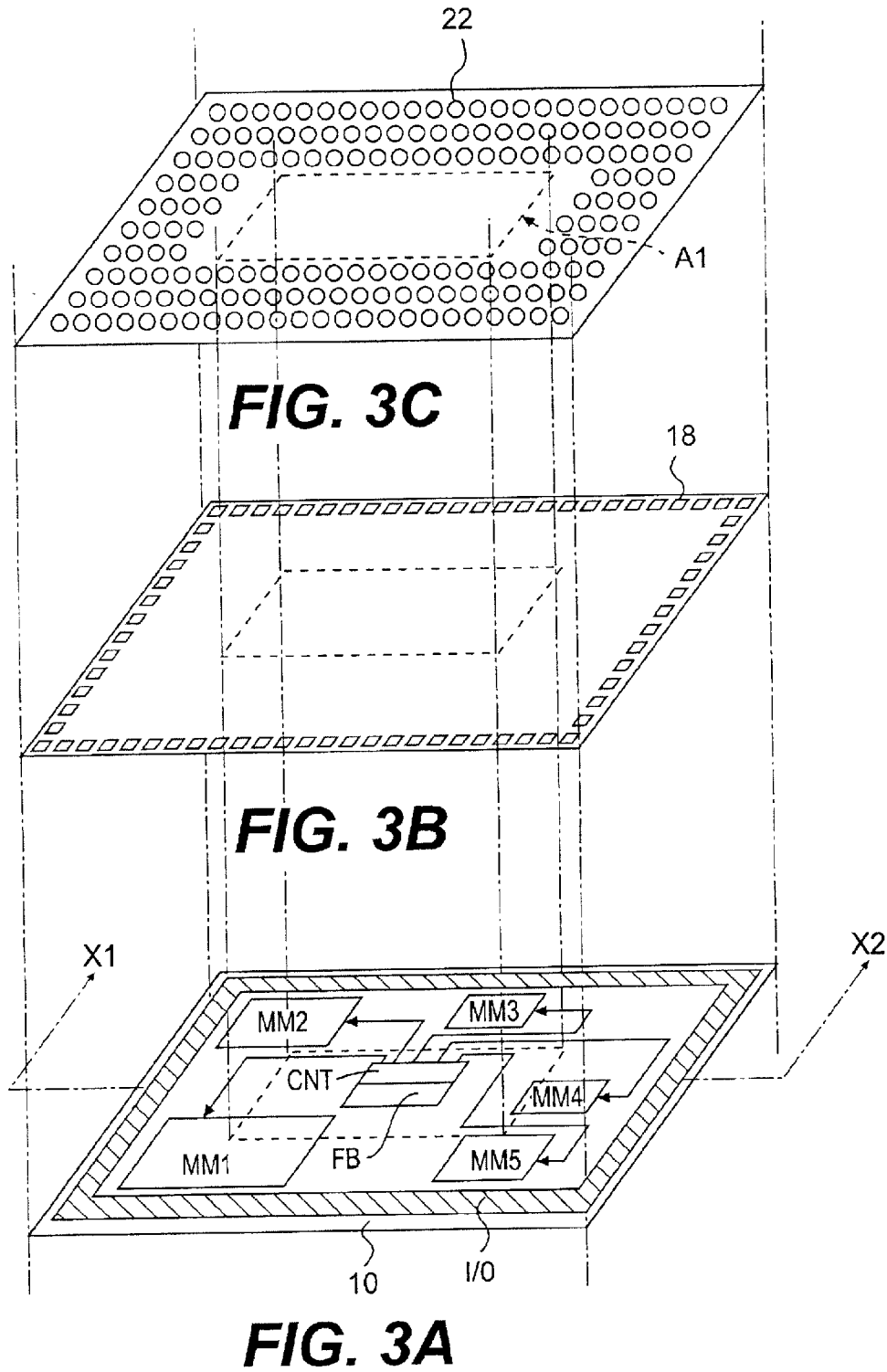
FIGS. 3A to 3C show a view of the layout of each element included in a semiconductor memory device in accordance with one embodiment of this invention.
Figure 4:
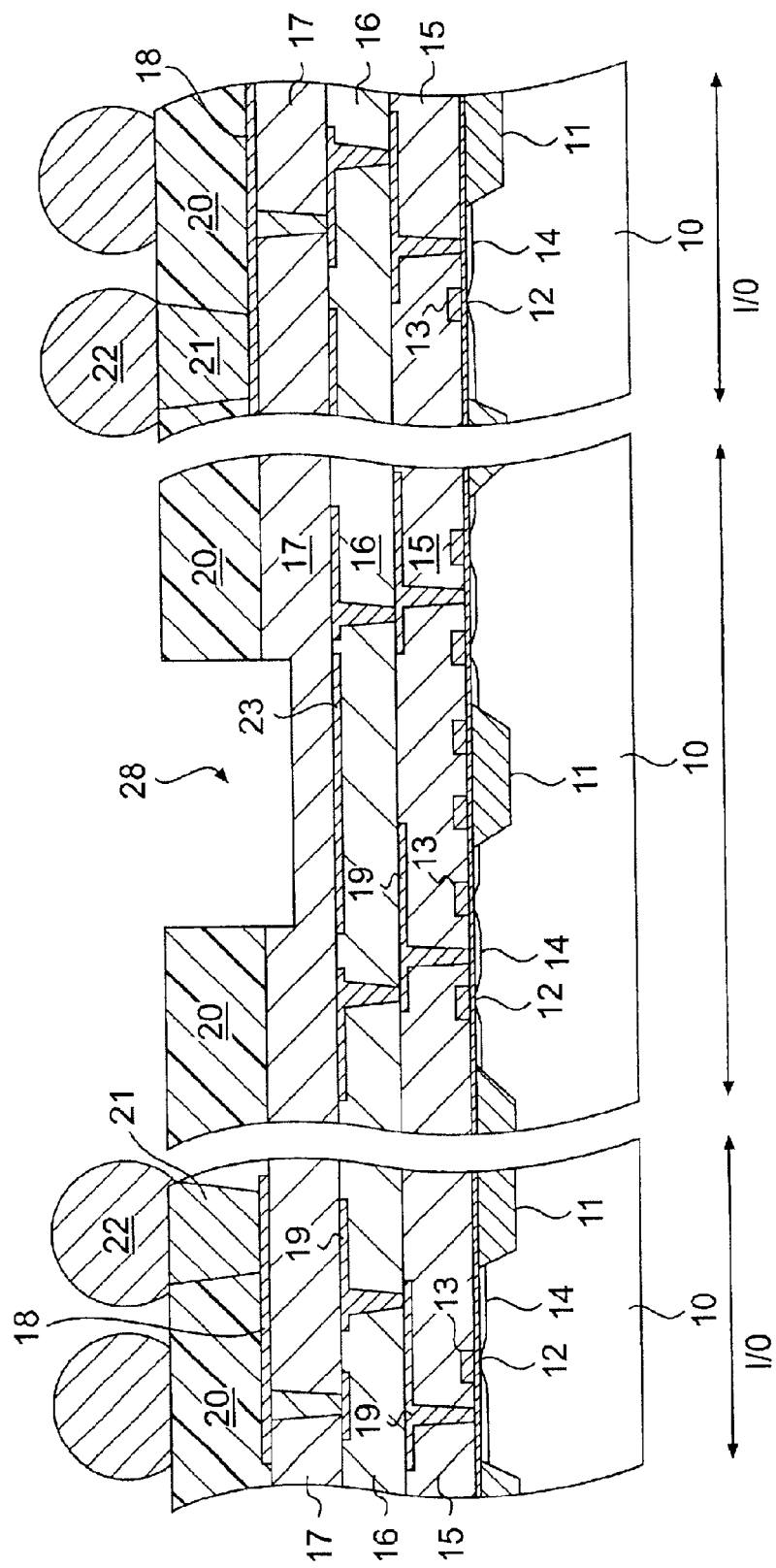
FIG. 4 is a cross-sectional view along a line X1-X2 in FIGS. 3A to 3C.

FIGS. 3A to 3C are plan views of an exemplary embodiment of the present invention. FIG. 3A shows the layout of memory macros MM1 to MM5, a fuse block (FB), a control circuit (CNT), and an input-output circuit block (I/O) on semiconductor substrate 10. FIG. 3B shows the layout of an input-output pad 18, and FIG. 3C shows the layout of bumps 22. FIG. 4 is a sectional view along a line X1-X2 in FIGS. 3A to 3C.

As shown in these figures, an element separating area 11 is formed within a semiconductor substrate 10. Further, a MOS transistor is formed, having a gate insulating film 12 formed on the semiconductor substrate 10, a gate electrode 13, and an impurity diffusion layer 14 formed on the surface of the semiconductor substrate 10.

Plural memory macros MM1 to MM5, a fuse block FB, a control circuit CNT and an input-output circuit block I/O are formed in the semiconductor substrate 10, comprising these MOS transistors, capacitor elements (not shown) and other components.

The fuse block FB has plural fuse elements used in redundancy of the memory macros MM1 to MM5, and the address (defective address) of a defective cell included within the memory macros MM1 to MM5 may be written to the fuse element.

The control circuit CNT is used in the redundancy of the memory macros MM1 to MM5, and an address signal of a memory cell is inputted to this control circuit CNT. This input address to the CNT and the defective address written to the fuse element are compared with each other. When these addresses are determined to be the same, a word line or a bit line of a spare cell is selected.

The fuse element within the fuse block FB and the control circuit CNT are shared by each of the memory macros MM1 to MM5. Each of the memory macros MM1 to MM5 includes a plurality of memory cells. A technique for replacing a defective memory cell using a redundancy cell (i.e., spare cell) may be called a "redundancy technique". Further, the term "redundancy" used here means "a remedy measure of a defective cell using a redundancy cell".

The input-output circuit block I/O includes an input-output circuit such as an input-output buffer, etc. Signals are transmitted and received through this input-output circuit between the memory macros MM1 to MM5 and the exterior.

An insulating layer is formed on the semiconductor substrate 10 so as to cover the above-described MOS transistor. For example, the insulating layer may have a multilayer structure in which plural insulating films such as interlayer insulating films 15, 16, and 17 are deposited. Additionally, the insulating layer may also include a resin layer 20. Resin layer 20 may be deposited, for example, on insulating film 17, as shown in FIG. 4. A multilayer metallic wiring 19 for electrically connecting a semiconductor element (the above MOS transistor, etc.) formed on semiconductor substrate 10 is formed within the interlayer insulating films 15, 16, 17. A metallic wiring layer 23 comprising the fuse element within the fuse block FB is formed on the interlayer insulating film 16. Further, a metallic wiring layer 18 formed on the interlayer insulating film 17 is connected to the input-output circuit block I/O by the metallic wiring layer 19, and also may function as an input-output pad in certain embodiments. This input-output pad 18 is arranged along an edge portion of the interlayer insulating film 17. As previously stated, resin layer 20 may be formed on the interlayer insulating film 17.

In an exemplary embodiment, an opening window 28 is arranged so as to include a depression penetrating interlayer insulating film 17 from the surface of the resin 20. This opening window 28 is arranged so as to be located just above the fuse element 23. A primary feature of window 28 is the lack of bumps formed within the area of window 28. Window 28 serves as an access to the fuse element 23 during the laser blow process. Specifically, a writing operation to the fuse element 23 located just below the opening window 28 may be performed by a laser beam irradiated into the opening window 28.

A metallic plug 21 electrically connected to the input-output pad 18 is arranged within the resin 20 by a metallic wiring layer molded integrally with the input-output pad 18, and a bump 22 (input-output terminal) is arranged on this metallic plug 21. The bump 22 is formed in plural lines along an edge portion on the resin 20, and no bumps are formed on a central portion of a face of the resin 20 designated as area A1. It is important to arrange the fuse element 23 on the interlayer insulating film 17 in an area just below the space area A1 in which no bump 22 is formed. This is because no laser blow of the fuse element 23 can be performed when the bump 22 exists on the fuse element 23.

Figure 2:
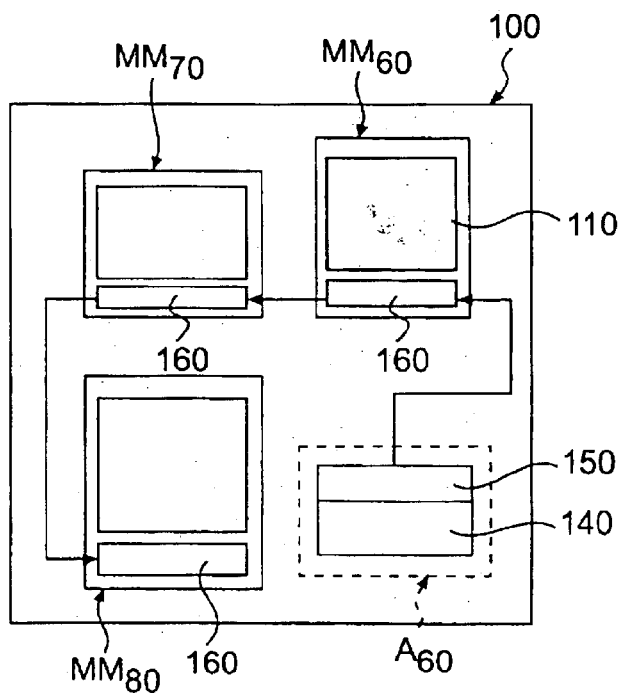
FIG. 2 is a plan view of a related semiconductor device.

In an exemplary embodiment of the present invention, fuse element 23 is formed on the interlayer insulating film 16, as shown in FIG. 4. In this case, fuse element 23 may be formed by the same metallic wiring used to form metallic wiring layer 19 on interlayer insulating film 16. Alternatively, however, fuse element 23 may be formed on a lower interlayer insulating film (e.g., interlayer insulating film 15, as shown in FIG. 2). Further, the fuse element 23 may be formed on interlayer insulating film 17 or resin 20 (on the space area A1, as shown in FIGS. 3A to 3C).

While FIG. 4 shows window 28 as including a depression extending into insulating layer 17, no depression is required to form window 28. The depression allows the use of a reduced-intensity laser beam during the blow process, but with added care using a higher intensity laser beam, the laser blow process may be accomplished even in the absence of a depression in window 28. An additional feature of window 28 is the absence of bumps 22. This absence of bumps 22 in the window area 28 allows the laser to access the fuse element 23 located in an area corresponding to window 28 (e.g., below window 28).

Figure 5:
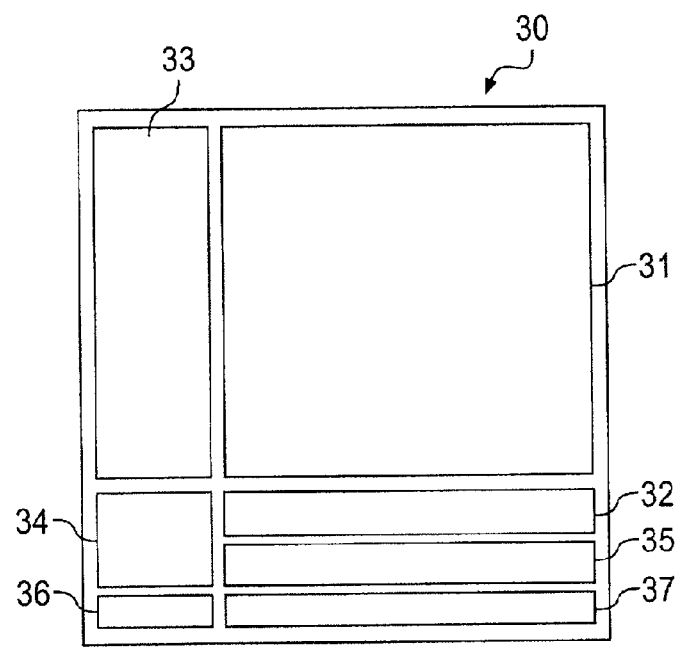
FIG. 5 is a block diagram of a DRAM macro formed in the semiconductor device in accordance with one embodiment of this invention.

One of the memory macros MM1 to MM5 may comprise a DRAM macro, as shown in FIG. 5. DRAM macro 30 includes a memory cell array 31, a column decoder 32, a low decoder 33, a predecoder 34, a sense amplifier 35, an input circuit 36, and an input-output circuit 37. These components are common to not only the DRAM macro, but also to all the memory macros MM1 to MM5. As shown in FIG. 5, DRAM macro 30 does not include either a fuse block for redundancy or a control circuit. Rather, the fuse element, within the fuse block FB, and the control circuit CNT, as shown in FIGS. 3A to 3C, are used in the redundancy.

In terms of function, the predecoder 34 gives an address of a bit line and a word line to each of the column decoder 32 and the low decoder 33 on the basis of an address signal inputted to the input circuit 36 and a write enable signal at a writing time. The column decoder 32 and the low decoder 33 select the bit line and the word line of the memory cell array 31 on the basis of this address. At a reading time of data, the data are outputted to the selected bit line, amplified by the sense amplifier 35, and outputted as a data signal from the input-output circuit 37. On the other hand, at a writing time of data, the data signal inputted to the input-output circuit 37 is written to a selected memory cell by the column decoder 32 and the low decoder 33.

Figure 6:
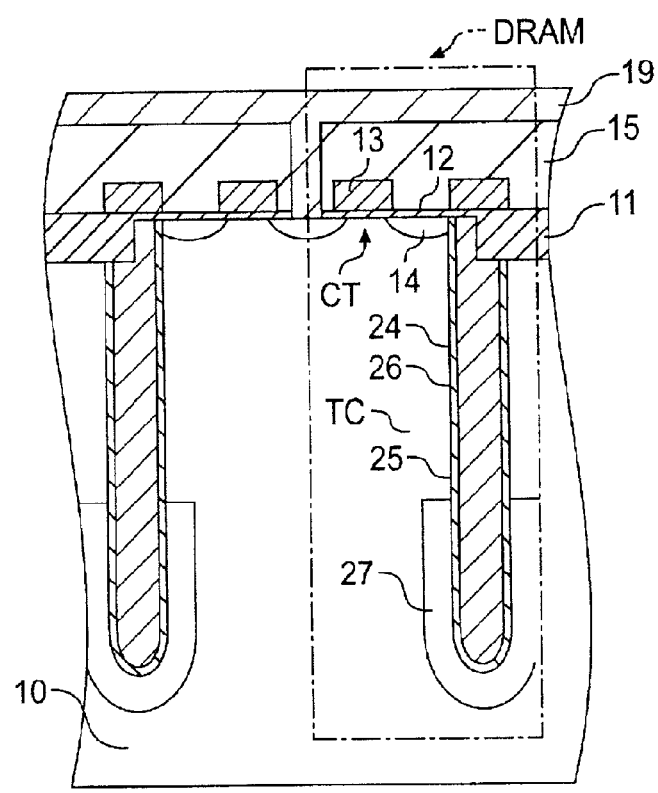
FIG. 6 is a sectional view of a DRAM cell included in the DRAM macro formed in the semiconductor device in accordance with one embodiment mode of this invention.

FIG. 6 is a sectional view of a DRAM cell arranged in the memory cell array 31 within the above DRAM macro 30. The DRAM cell includes a trench structure in a cell capacitor. As shown in FIG. 6, the trench capacitor TC has a trench 24 formed within the semiconductor substrate 10, a capacitor insulating film 25 formed in a side wall of the trench 24, a storage node electrode 26 for burying the trench 24, and a plate electrode 27 arranged within the semiconductor substrate 10 and coming in contact with the trench 24. The DRAM cell is formed by connecting an impurity diffusion layer (source area) 14 of a cell transistor CT, which has the same construction as the above-described MOS transistor, to a storage node electrode 26 of the trench capacitor TC.

Figure 7:
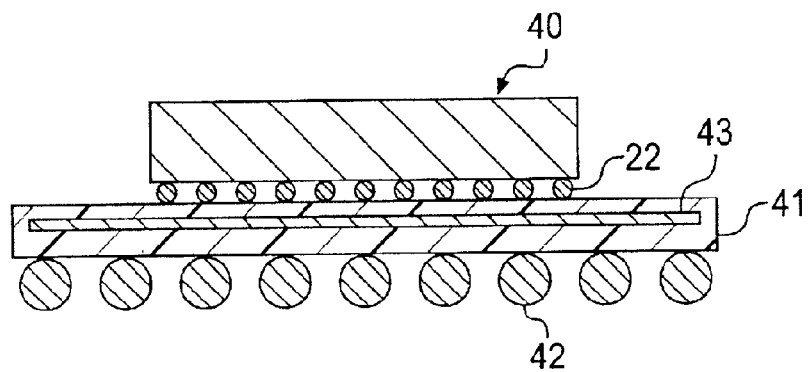
FIG. 7 is a sectional view of a semiconductor package mounting the semiconductor device in accordance with one embodiment mode of this invention.

FIG. 7 is a sectional view of a semiconductor package mounting the above semiconductor device (semiconductor chip) thereto. For example, this semiconductor package is a CSP (Chip Size Package) in which the above semiconductor chip is flipchip-mounted onto a circuit board. As shown in FIG. 7, the semiconductor chip 40 having the structure shown in FIGS. 3A to 3C and 4 is flipchip-mounted onto the circuit board 41 with the forming face of a semiconductor element as a lower face. The semiconductor chip 40 is electrically connected onto the circuit board 41 by a bump 22 arranged on the surface of the semiconductor chip 40. A bump 42 is arranged on a rear face of the circuit board 41 and serves as an external connecting terminal. This bump 42 and the bump 22 are connected to each other by a metallic wiring layer 43 arranged within the circuit board 41.

In an exemplary embodiment of the present invention, the fuse element and the control circuit are commonly shared between the respective macros and are located in a central portion of the semiconductor substrate. The central portion of the semiconductor substrate includes at least a center point, referenced with respect to the edges of the semiconductor substrate, on the surface of the semiconductor substrate where the memory macros reside. Additionally, the central portion of the semiconductor substrate for locating the fuse element and the control circuit may be an area just below the space area A1, as shown in FIGS. 3A to 3C, in which no bump is formed on a face of the resin 20. Therefore, the following advantages may be realized.

First, because the fuse element and the control circuit (and a spare cell) are commonly used between the respective macros, remedy efficiency is high and area efficiency is good. Further, because the fuse elements and corresponding space area A1 having no bumps may be located in an approximately central portion on a semiconductor substrate face, restriction with respect to a bump arrangement is greatly relaxed. Additionally, the approximately central portion of the semiconductor substrate for locating the fuse element is also a place into which stress is relatively low (especially as compared to the edge regions of the semiconductor substrate). Therefore, application of strong stresses to the fuse element may be avoided. Consequently, the reliability of redundancy is improved. Because the fuse block exists in the approximately central portion on the semiconductor substrate face, each wiring distance between the fuse element and each macro may be approximately equal. Accordingly, an influence exerted by a parasitic element in wiring such as a delay time, resistance, etc., may be about the same for every macro. This effect improves the electrical characteristics of the device. Further, because the fuse elements for all the macros are located together, the moving distance of a laser during a laser blow is reduced. As a result, the laser blow time may be shortened.

As mentioned above, the bump 22 is connected via metallic wiring to an input-output pad arranged along an edge portion of the interlayer insulating film 17. Accordingly, to reduce a parasitic element generated by the connection between the bump 22 and the input-output pads 18, it is preferable to minimize the length of this connection. Therefore, because the input-output pads 18, which are connected to an input-output circuit I/O, are arranged along the edge portion on the semiconductor substrate face, it follows that an appropriate position for bumps 22 is a position close to input-output pads 18. For example, bumps 22 may be sequentially arranged on the resin 20 along its edge portion (see FIG. 3A).

For at least this reason, the structure of the related device shown in FIG. 2 is not problematic. Specifically, because an input-output pad is included at the edge of the structure of FIG. 2, the edge areas of the semiconductor substrate face are the preferred location for placing bumps. However, the presence of fuse block 140 located at the corner of the semiconductor substrate creates an area in which bumps may not be formed. Instead, the bumps that would have been formed in the area of the fuse block 140 are located in the central area of the semiconductor substrate. As a result, the metallic wiring connecting the bumps to the input-output pad circuit is lengthened, and as a result, parasitic electrical effects may be increased.

In the present invention, however, an ideal bump arrangement may be realized by arranging the fuse block FB in the approximately central portion (see FIG. 3C on the semiconductor substrate face (on the resin 20). As the bumps 22 are sequentially arranged along the edge portion on the resin 20, to coincide with the input output circuit, the central portion of the semiconductor substrate becomes a location naturally absent of bumps. Placing the fuse block in this approximately central location of the semiconductor substrate serves as the most efficient arrangement of the fuse block with respect to the bumps.

Figure 8:
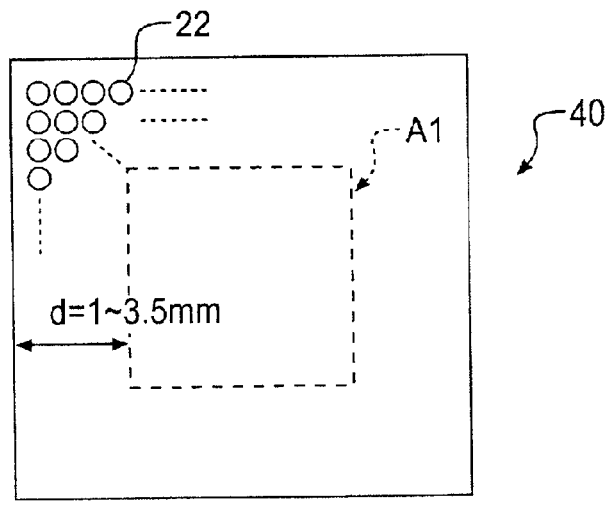
FIG. 8 is a plan view of the semiconductor device in accordance with one embodiment mode of this invention.

FIG. 8 is a plan view of the semiconductor device, and shows an arrangement pattern of bumps 22. As shown in FIG. 8, bumps 22 are sequentially arranged from an edge portion on the upper face of a semiconductor chip to the interior so as to surround a central area A1. For example, when the length of one side of the chip ranges from 10 to 20 mm, a pad number ranges from 700 to 2000, a memory macro number ranges from 1 to 50, and a bump diameter ranges from approximately 80 to 100 $\mu$m, bumps 22 are arranged in about three to four lines. Further, an area on the upper face of the semiconductor chip in which bumps 22 are located ranges from about 1 to 3.5 mm from the edge of the semiconductor chip. Therefore, the fuse block may be arranged in an area separated from the edge of the semiconductor chip by at least about 1 to 3.5 mm.

The number of bumps may vary in accordance with the design of the semiconductor chip. For example, when the length of one side of the chip is 10 mm and the pad number is 700, the forming area of the bump may be set to an area separated by about 1.5 mm from the edge portion. When the length of one side of the chip is 20 mm and the pad number is 2000, the forming area of the bump may be set to an area separated by about 2 mm from the edge portion. When the length of one side of the chip is 10 mm and the pad number is 2000, the forming area of the bump may be set to an area separated by about 3.5 mm from the edge portion. When the length of one side of the chip is 20 mm and the pad number is 700, the forming area of the bump may be set to an area separated by about 1 mm from the edge portion.

According to an exemplary embodiment of the present invention, the fuse block may be arranged within an area determined by the sequential arrangement of bumps 22 from the edge portion of the semiconductor chip. While the fuse blocks for each macro may be collected as one fuse block, the fuse blocks for each macro may also be individually arranged as long as they are within the centralized area, or window area.

Figure 9:
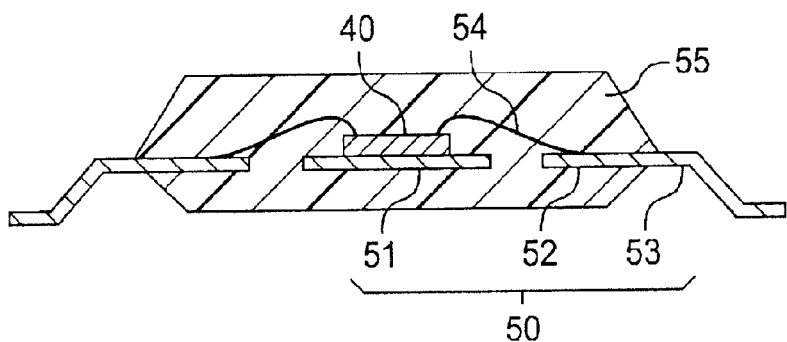
FIG. 9 is a sectional view of a semiconductor package in a modified example of another embodiment mode of this invention.

The present invention is not limited by the kind of packaging. FIG. 9 is a sectional view of a plastic package using a lead frame. As shown in FIG. 9, a semiconductor chip 40 is mounted onto a die pad 51 of the lead frame 50. An input-output pad 18 of the semiconductor chip 40 is wire-bonded to an inner lead 52 of the lead frame 50. The inner lead 52 is connected to an outer lead 53, and seal resin 55 is arranged so as to cover the semiconductor chip 40, bonding wire 54, the die pad 51, and the inner lead 52. Thus, the present application can also be applied to a wire-bonded semiconductor chip. Further, the present application can also be applied to a package utilizing TAB (Tape Automated Bonding) and an MCM (Multi Chip Module).

Figures 10A, 10B:
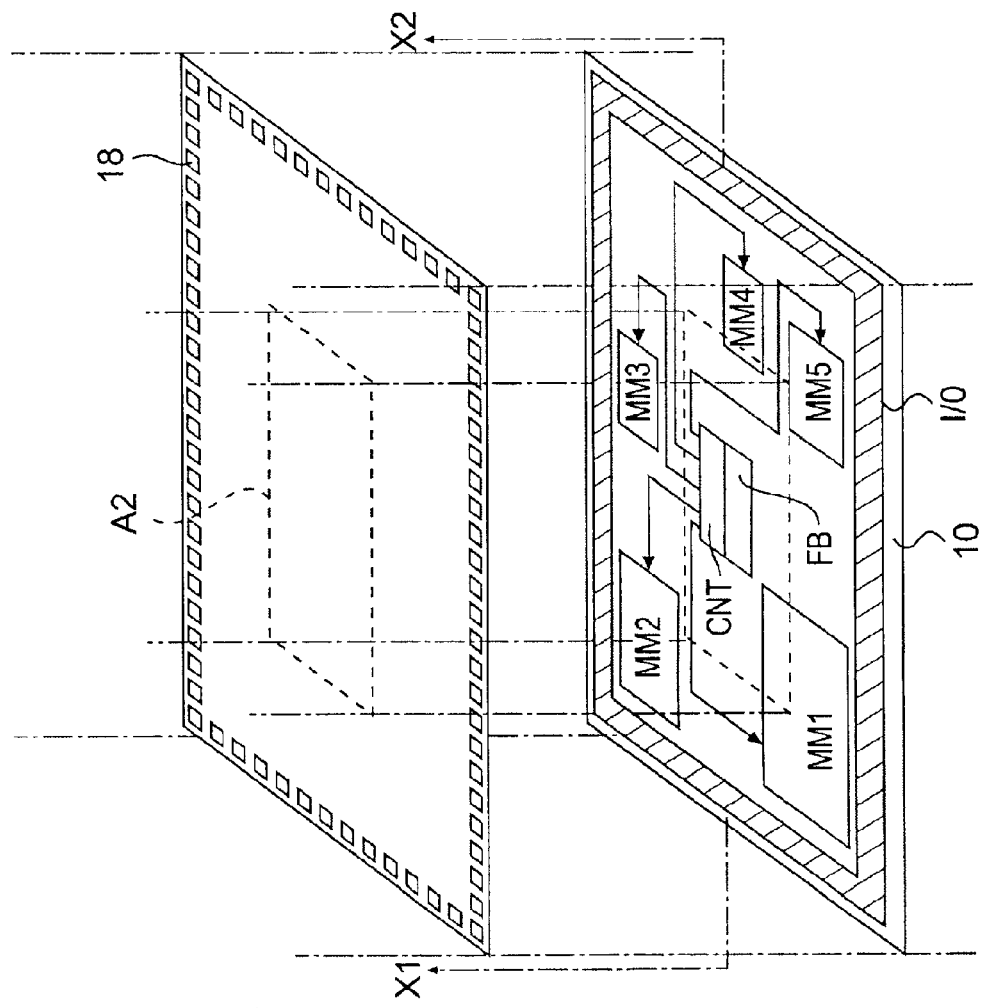
FIGS. 10A and 10B show the lay out of each element included in a semiconductor device in accordance with another embodiment mode of this invention.

In the embodiment, as shown in FIGS. 3A to 3C and 4, the exterior connection to the metallic wiring layer forming input-output pads 18 is through bumps 22. FIGS. 10A and 10B are plan views, however, showing the layout of each element comprising the semiconductor device in the exemplary embodiment as shown in FIG. 9, which includes packaging by wire bonding. FIG. 10A shows the layout of a memory macro, a fuse block, a control circuit, and an input-output circuit block. FIG. 10B shows the layout of an input-output pad. In the case of a product packaged by wire bonding, it is not necessary to form resin 20 and bumps 22 for covering the input-output pads 18. Instead, the wafer-forming process is terminated upon formation of the input-output pads 18 on the insulating layer. In this embodiment, a window portion, denoted by area A2 on FIG. 10B, for example, is present on the insulating layer. The window portion is surrounded by input-output pads 18. Additionally, the window portion may be centrally located on the insulating layer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What claimed is:

1. A semiconductor device comprising:
   a semiconductor substrate;
   a plurality of memory macros arranged on the semiconductor substrate, said memory macros each including a plurality of memory cells;
   an insulating layer formed on said semiconductor substrate and covering said memory macros, said insulating layer including a window portion;
   input-output terminals arranged on surface of said insulating layer along an edge portion of said insulating layer surface such that the input-output terminals surround the window portion, said input-output terminals transmitting and receiving signals between said memory macros and a circuit external to said semiconductor device; and
   a fuse block arranged on an area of said insulating layer corresponding to said window portion, said fuse block comprising a plurality of fuse elements used to remedy defective portions of said plurality of memory cells in said plurality of memory macros.

2. The semiconductor device of claim 1, wherein the semiconductor substrate is mounted onto a die pad of a lead frame, and the input-output terminals are wire-bonded to an inner lead of the lead frame.

3. The semiconductor device according to claim 1, wherein said insulating layer is a multilayer structure including a plurality of insulating films, said input-output terminals are arranged on an uppermost layer of said multilayer structure, and said fuse element is arranged on an insulating film disposed below the uppermost layer.

4. The semiconductor device according to claim 1, wherein said window portion is arranged at a central portion of said semiconductor substrate.

5. The semiconductor device according to claim 1, wherein said fuse block is directly connected to at least one of said plurality of memory macros of said semiconductor device.

6. The semiconductor device according to claim 5, wherein said fuse block is directly connected to each of said plurality of memory macros of said semiconductor device.

7. The semiconductor device according to claim 1,
   wherein the fuse block further comprises a spare cell array and a control circuit arranged and used to remedy a defective portion of said plurality of memory cells, said spare cell array including a plurality of spare cells for replacing said defective portion of said plurality of memory cells, and
   wherein said control circuit determines agreement between an input address and a defective address written to said fuse element, and when the input address and the defective address agree, the control circuit commands replacement of said defective portion of said plurality of memory cells corresponding to said defective address with spare memory cells.

8. The semiconductor device according to claim 1, wherein said fuse block is arranged on said semiconductor substrate and is separated by at least about 1.0 mm from an edge portion of said semiconductor substrate.

9. The semiconductor device according to claim 8, wherein said fuse block is arranged on said semiconductor substrate and is separated by at least about 3.5 mm from an edge portion of said semiconductor substrate.

10. A semiconductor device comprising:
    a semiconductor substrate;
    a plurality of memory macros arranged on the semiconductor substrate, said memory macros each including a plurality of memory cells;
    an insulating layer formed on said semiconductor substrate and covering said plurality of memory macros, said insulating layer including a window portion located at a central portion of the semiconductor substrate;
    input-output terminals arranged in line on a surface of said insulating layer along an edge portion of said insulating layer, said input-output terminals transmitting and receiving signals between said memory macros and a circuit external to said semiconductor device;

a resin layer disposed on said insulating layer;

bump terminals arranged in line on a surface of said resin layer; and a fuse block arranged on a space corresponding to said window portion, said fuse block comprising plural fuse elements used to remedy defective portions of said plurality of memory cells in said plurality of memory macros.

11. The semiconductor device of claim 10, wherein the window portion includes a depression that penetrates through the resin layer and into the insulating layer.

12. The semiconductor device of claim 10, wherein the window portion includes no bump terminals.

13. The semiconductor device according to claim 10, wherein said insulating layer is a multilayer structure including a plurality of insulating films, said input-output terminals are arranged on an uppermost layer of said multilayer structure, and said fuse block is arranged on an insulating film disposed below the uppermost layer.

14. The semiconductor device according to claim 10, wherein said fuse block is directly connected to at least one of said plurality of memory macros of said semiconductor device.

15. The semiconductor device according to claim 14, wherein said fuse block is directly connected to each of said plurality of memory macros of said semiconductor device.

16. The semiconductor device according to claim 10, wherein the fuse block further comprises a spare cell array and a control circuit arranged and used to remedy a defective portion of said plurality of memory cells, said spare cell array including a plurality of spare cells for replacing said defective portion of said plurality of memory cells, and wherein said control circuit determines agreement between an input address and a defective address written to said fuse element, and when the input address and the defective address agree, the control circuit commands replacement of said defective portion of said plurality of memory cells corresponding to said defective address with spare memory cells.

17. The semiconductor device according to claim 10, wherein said fuse block is surrounded by input-output terminals.

18. The semiconductor device according to claim 10, wherein said fuse block is arranged on said semiconductor substrate and is separated by at least about 1.0 mm from an edge portion of said semiconductor substrate.

19. The semiconductor device according to claim 18, wherein said fuse block is arranged on said semiconductor substrate and is separated by at least about 3.5 mm from an edge portion of said semiconductor substrate.

20. The semiconductor device according to claim 10, wherein said bump terminals are arranged in plurality of lines.

21. The semiconductor device according to claim 10, wherein said semiconductor device is a CSP (chip sized package).

22. The semiconductor device according to claim 10, wherein said semiconductor device is includes TAB (tape automated bonding).

23. The semiconductor device according to claim 10, wherein said semiconductor device is multi-chip module.

* * * * *